(12) United States Patent
Hsing et al.

(10) Patent No.: US 10,883,168 B2
(45) Date of Patent: Jan. 5, 2021

(54) PROCESSING SYSTEM FOR SMALL SUBSTRATES

(71) Applicant: Massachusetts Institute Of Technology, Cambridge, MA (US)

(72) Inventors: Mitchell David Hsing, Cambridge, MA (US); Parker Andrew Gould, Cambridge, MA (US); Martin Arnold Schmidt, Reading, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/325,224

(22) PCT Filed: Sep. 10, 2015

(86) PCT No.: PCT/US2015/049292
§ 371 (c)(1),
(2) Date: Jan. 10, 2017

(87) PCT Pub. No.: WO2016/040547
PCT Pub. Date: Mar. 17, 2016

(65) Prior Publication Data
US 2017/0194129 A1  Jul. 6, 2017

Related U.S. Application Data

(60) Provisional application No. 62/048,850, filed on Sep. 11, 2014, provisional application No. 62/180,832, filed on Jun. 17, 2015.

(51) Int. Cl.
*C23C 14/34* (2006.01)
*C23C 14/48* (2006.01)
(Continued)

(52) U.S. Cl.
CPC ............. *C23C 14/34* (2013.01); *C23C 14/48* (2013.01); *C23C 14/50* (2013.01); *C23C 14/541* (2013.01);
(Continued)

(58) Field of Classification Search
CPC ....... C23C 14/541; C23C 14/50; C23C 14/48; C23C 14/34; C23C 16/45565;
(Continued)

(56) References Cited

U.S. PATENT DOCUMENTS 3,756,939 A * 9/1973 Hurwitt ............... C23C 14/3407
204/298.12
4,100,055 A * 7/1978 Rainey ................. H01J 37/3408
204/298.12
(Continued)

FOREIGN PATENT DOCUMENTS

JP       2004-342984 A    12/2004

OTHER PUBLICATIONS

International Search Report and Written Opinion dated Jan. 12, 2016 in corresponding PCT application No. PCT/US15/049292.
(Continued)

*Primary Examiner* — Michael A Band
(74) *Attorney, Agent, or Firm* — Nields, Lemack & Frame, LLC

(57) ABSTRACT

A substrate processing system that is optimized for the production of smaller volumes of semiconductor components is disclosed. To minimize cost, the substrate processing system is designed to accommodate smaller substrates, such as substrates having a diameter of roughly one inch. Additionally, the components of the substrate processing system are designed to be interchangeable, thereby further reducing cost and complexity. In certain embodiments, the substrate processing system comprises a lower assembly,
(Continued)

which may be used with one or more upper assemblies. The lower assembly is used to support the substrate and provide many of the fluid, electrical, and sensor connections, while the upper assemblies include the apparatus required to perform a certain fabrication function. For example, different upper assemblies may exist for deposition, etching, sputtering and ion implantation.

24 Claims, 12 Drawing Sheets

(51) Int. Cl.
C23C 14/50 (2006.01)
C23C 14/54 (2006.01)
H01J 37/32 (2006.01)
H01J 37/34 (2006.01)
H01L 21/67 (2006.01)

(52) U.S. Cl.
CPC ..... *H01J 37/3211* (2013.01); *H01J 37/32605* (2013.01); *H01J 37/32715* (2013.01); *H01J 37/32724* (2013.01); *H01J 37/32807* (2013.01); *H01J 37/32816* (2013.01); *H01J 37/32889* (2013.01); *H01J 37/34* (2013.01); *H01J 37/3411* (2013.01); *H01L 21/6719* (2013.01)

(58) Field of Classification Search
CPC ........... H01J 37/32889; H01J 37/32715; H01J 37/32908; H01J 37/32935; H01J 37/32807; H01J 37/32724; H01J 37/3211; H01J 37/32816; H01J 37/34; H01J 37/32605; H01J 37/3411; H01L 21/6719
See application file for complete search history.

(56) References Cited

U.S. PATENT DOCUMENTS

| | | | |
|---|---|---|---|
| 4,852,516 A | 8/1989 | Rubin et al. | |
| 5,498,312 A | 3/1996 | Laermer et al. | |
| 5,501,893 A | 3/1996 | Laermer et al. | |
| 5,540,821 A * | 7/1996 | Tepman | H01L 21/68785 204/192.12 |
| 5,855,675 A | 1/1999 | Doering et al. | |
| 5,874,012 A | 2/1999 | Kanai et al. | |
| 5,942,855 A | 8/1999 | Hopwood | |
| 5,948,704 A | 9/1999 | Benjamin et al. | |
| 6,054,013 A | 4/2000 | Collins et al. | |
| 6,080,287 A | 6/2000 | Drewery et al. | |
| 6,103,069 A * | 8/2000 | Davenport | C23C 14/566 204/192.12 |
| 6,143,128 A | 11/2000 | Ameen et al. | |
| 6,178,918 B1 | 1/2001 | Van Os et al. | |
| 6,284,148 B1 | 9/2001 | Laermer et al. | |
| 6,287,435 B1 * | 9/2001 | Drewery | C23C 14/345 204/298.06 |
| 6,312,525 B1 | 11/2001 | Bright et al. | |
| 6,531,068 B2 | 3/2003 | Laermer et al. | |
| 6,596,115 B1 | 7/2003 | Menschig | |
| 6,596,133 B1 * | 7/2003 | Moslehi | C23C 14/0031 118/723 MP |
| 6,736,931 B2 | 5/2004 | Collins et al. | |
| 7,011,039 B1 | 3/2006 | Mohn et al. | |
| 7,182,816 B2 * | 2/2007 | Kleshock | C23C 14/564 118/715 |
| 7,413,106 B2 | 8/2008 | Wuersch et al. | |
| 7,504,604 B2 | 3/2009 | Rossopoulos et al. | |
| 7,625,198 B2 | 12/2009 | Lipson et al. | |
| 7,828,928 B2 | 11/2010 | Makino et al. | |
| 8,540,843 B2 | 9/2013 | Sharpless et al. | |
| 8,800,998 B2 | 8/2014 | Erickson et al. | |
| 2005/0205209 A1 * | 9/2005 | Mosden | H01L 21/67069 156/345.31 |
| 2008/0202419 A1 | 8/2008 | Smith et al. | |
| 2009/0056116 A1 | 3/2009 | Presley et al. | |
| 2009/0178751 A1 | 7/2009 | Presley et al. | |
| 2009/0326703 A1 | 12/2009 | Presley et al. | |
| 2011/0056626 A1 | 3/2011 | Brown et al. | |
| 2012/0285819 A1 | 11/2012 | Child et al. | |
| 2013/0162117 A1 | 6/2013 | Hara et al. | |
| 2013/0167339 A1 | 7/2013 | Hara et al. | |
| 2014/0154870 A1 | 6/2014 | Nakamura et al. | |

OTHER PUBLICATIONS

International Preliminary Report on Patentability dated Mar. 14, 2017 in corresponding PCT application No. PCT/US15/049292.
Goodyear et al., "High Resolution Inductively Coupled Plasma Etching of 30nm Lines and Spaces in Tungsten and Silicon," Journal of Vacuum Science & Technology B, vol. 18, Iss.6, pp. 3471-3475, 2000.
Järvenpää et al., "TUT-Microfactory—A Small-Size, Modular and Sustainable Production System," Proceedings of the 11th Global Conference on Sustainable Manufacturing—Innovative Solutions, pp. 78-83, 2013.
Rajaraman et al., "DRIE and Bonding Assisted Low Cost MEMS Processing of In-Plane HAR Inertial Sensors," The Seventh International Conference on Advanced Semiconductor 327 Devices and Microsystems, pp. 327-330, Oct. 2008.
Verettas et al., "'Pocket Factory': Concept of Miniaturized Modular Cleanrooms," 1st Topical Meeting on Microfactories "Desktop MEMS and Nano Factories" Oct. 2005.
Zhakypov et al., "Desktop Microfactory for High Precision Assembly and Machining," Industrial Electronics (ISIE), 2014 IEEE 23rd International Symposium; Jun. 1-4, 2014; p. 1192-1197.

* cited by examiner

PROCESSING SYSTEM FOR SMALL SUBSTRATES

This application claims priority of U.S. Provisional Patent Application Ser. Nos. 62/048,850, filed Sep. 11, 2014 and 62/180,832, filed Jun. 17, 2015, the disclosures of which are incorporated herein by reference in their entireties.

Embodiments of the present disclosure relate to a system for the processing of micro- and nanoscale devices using small substrates, such as substrates with a characteristic dimension of 1-2".

BACKGROUND

Semiconductor fabrication has continued to evolve following the prediction by Gordon Moore. Each year, the complexity of devices on a substrate roughly doubles. To support this exponential increase in device complexity, improvements are continuously being made to semiconductor fabrication equipment.

As a result, this fabrication equipment continues to grow in complexity, which also leads to a corresponding increase in the cost of this equipment. To justify the cost of the semiconductor fabrication equipment, equipment owners need to produce a large quantity of devices per year. This implies that the semiconductor fabrication equipment is often run continuously, 24 hours a day, and stopped only for repair or preventative maintenance.

In addition, to increase the number of devices that can be produced, the size of the unprocessed substrate, also referred to as a wafer, has increased in size. An increase in the size of the substrate, coupled with a decrease in the size of each device, results in a cumulative effect, where the number of devices per substrate increases dramatically.

While this approach leads to lower costs for semiconductor devices, such as memory devices, central processing units (CPUs), and other high volume components, there are some significant drawbacks.

One of the most obvious drawbacks of this trend is the negative impact that is has on the production of lower volume components. For example, certain types of devices, such as microelectromechanical systems (MEMS) sensors, may be desirable, but their projected volume is typically less than that of, for example, memory devices.

As a result, it often becomes impractical for the designers of these lower volume components to purchase their own dedicated semiconductor fabrication equipment. Furthermore, reserving fabrication time at a contract-based semiconductor fabrication company (generally known as a foundry) may impractical, as the costs (both financial and temporal) of that fabrication time may be prohibitive. Furthermore, these semiconductor fabrication contract companies may be reluctant to produce several distinct low volume components as opposed to fewer, higher volume components.

Consequently, designers of low volume components, such as early-stage businesses or research facilities, are at a serious disadvantage. Therefore, a semiconductor fabrication system that is optimized for smaller lot sizes would be highly desirable. Further, the ability to create such a semiconductor fabrication system at a reasonable cost would be very advantageous. Additionally, a small footprint may also be beneficial.

SUMMARY

A substrate processing system that is optimized for the production of smaller volumes of devices is disclosed. To minimize cost, the substrate processing system is designed to accommodate smaller substrates, such as round substrates having diameters of 1-2 inches. Additionally, the components of this substrate processing system are designed to be modular and interchangeable, thereby further reducing cost and complexity. In certain embodiments, the substrate processing system comprises a lower assembly, which may be used with one or more upper assemblies. The lower assembly is used to support the substrate and provide many of the fluid, electrical, and diagnostic connections, while the upper assemblies include the apparatus required to perform a certain fabrication function. For example, different upper assemblies may exist for deposition, etching, sputtering and ion implantation.

According to one aspect, a substrate processing system is disclosed. The system comprises a lower assembly, comprising: a first predefined interface; a second predefined interface; and a vacuum port; a chuck assembly, adapted to hold a substrate and adapted to connect to the second predefined interface; and a plurality of upper assemblies, each adapted to connect to the first predefined interface, and each comprising a different processing apparatus, wherein any one of the plurality of upper assemblies may be connected to the first predefined interface, so as to form a respective processing chamber surrounding the substrate, so that the processing apparatus associated with the connected upper assembly may be used to process the substrate. In a certain embodiment, the first predefined interface comprises a first flange disposed on the lower assembly and a corresponding second flange disposed on each of the plurality of upper assemblies. In certain embodiments, wherein each of the plurality of upper assemblies comprises a chamber head, a hollow cylindrical tube, and a bottom flange, wherein fasteners, disposed outside the hollow cylindrical tube, are used to connect the chamber head, the hollow cylindrical tube and the bottom flange together. In some embodiments, the processing apparatus comprises a helical coil disposed around the hollow cylindrical tube. In some embodiments, the processing apparatus comprises a planar coil disposed on the top flange. In some embodiments, wherein the processing apparatus comprises a sputtering gun disposed within the processing chamber. In certain embodiments, the second predefined interface comprises a vacuum feedthrough.

According to a second aspect, a chuck assembly is disclosed. The chuck assembly comprises a feedthrough tube, having a first end extending to the exterior of a processing chamber, and a second end, and having two fluid connections; a coupling plate, disposed at the second end of the feedthrough tube, having two fluid feedthrough conduits in communication with the two fluid connections, an upper chuck piece, disposed adjacent to the coupling plate, and having internal conduits fabricated on an underside of the upper chuck piece and in contact with a top surface of the coupling plate, an inlet and outlet of the internal conduits being in communication with the two fluid feedthrough conduits; and a wafer attachment mechanism disposed on a top surface of the upper chuck piece, such that the upper chuck piece is between the coupling plate and the wafer clamp. In certain embodiments, the chuck assembly further comprises an isolation and alignment block, having a hollow interior and disposed at the second end of the feedthrough tube, wherein the coupling plate and the upper chuck piece are disposed within the hollow interior of the isolation and alignment block. In some embodiments, the coupling plate comprises an electrical connection, and wherein the coupling plate is adapted to be in communication with a power source. In a further embodiment, the electrical connection exits the chuck assembly through the first end of the feedthrough tube. In some embodiments, the coupling plate contains one or more sensor connections, and wherein the coupling plate is adapted to be in communication with equipment interfacing with these sensor connections. In some embodiments, the coupling plate comprises gas conduits, the upper chuck piece comprises gas passages, and further comprising a gas connection, adapted to connect to a heat transfer medium, such that the heat transfer medium can flow through the gas connection, the gas conduits and the gas passages to the top surface of the upper chuck piece. In certain embodiments, the wafer attachment mechanism comprises a wafer clamp, having one or more apertures defines region of a substrate to be processed, wherein the substrate is disposed between the top surface of the upper chuck piece and the wafer clamp. In certain embodiments, the wafer attachment mechanism comprises a wafer carrier, the wafer carrier comprises a substrate holder and an insulating clamp, wherein a substrate is disposed between the insulating clamp and the substrate holder, and wherein the substrate holder is removably attached to the upper chuck piece.

According to a third aspect, a method of processing a substrate is disclosed. The method comprises disposing the substrate on a chuck assembly within a lower assembly of a processing chamber; attaching a first upper assembly to the lower assembly; performing a first process on the substrate, where the first upper assembly is adapted to perform the first process; removing the first upper assembly from the lower assembly; attaching a second upper assembly to the lower assembly; and performing a second process on the substrate, different than the first process, where the second upper assembly is adapted to perform the second process. In certain embodiments, the first and second processes are selected from the group consisting of etching, amorphizing, deposition, sputtering and ion implantation.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
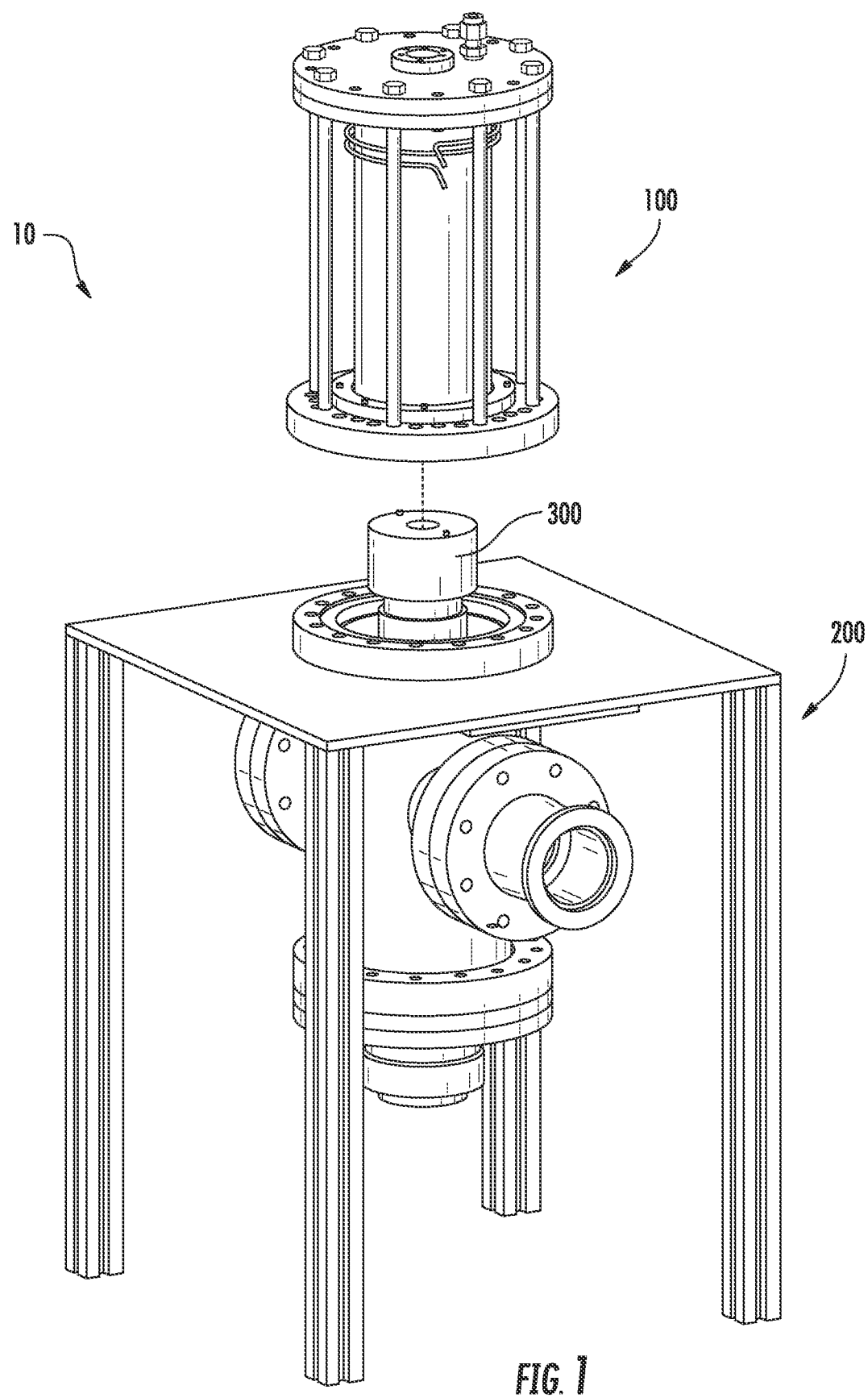
FIG. 1 shows a representative configuration for a substrate processing system according to one embodiment.

FIG. 1 shows a first embodiment of a substrate processing system 10. The substrate processing system 10 comprises an upper assembly 100 and a lower assembly 200. The upper assembly 100 and the lower assembly 200 may be held together using fasteners or interlocking geometries that connect the bottom flange of the upper assembly 100 to the lower assembly 200. A chuck assembly 300 is disposed within the lower assembly 200.

Figure 2:
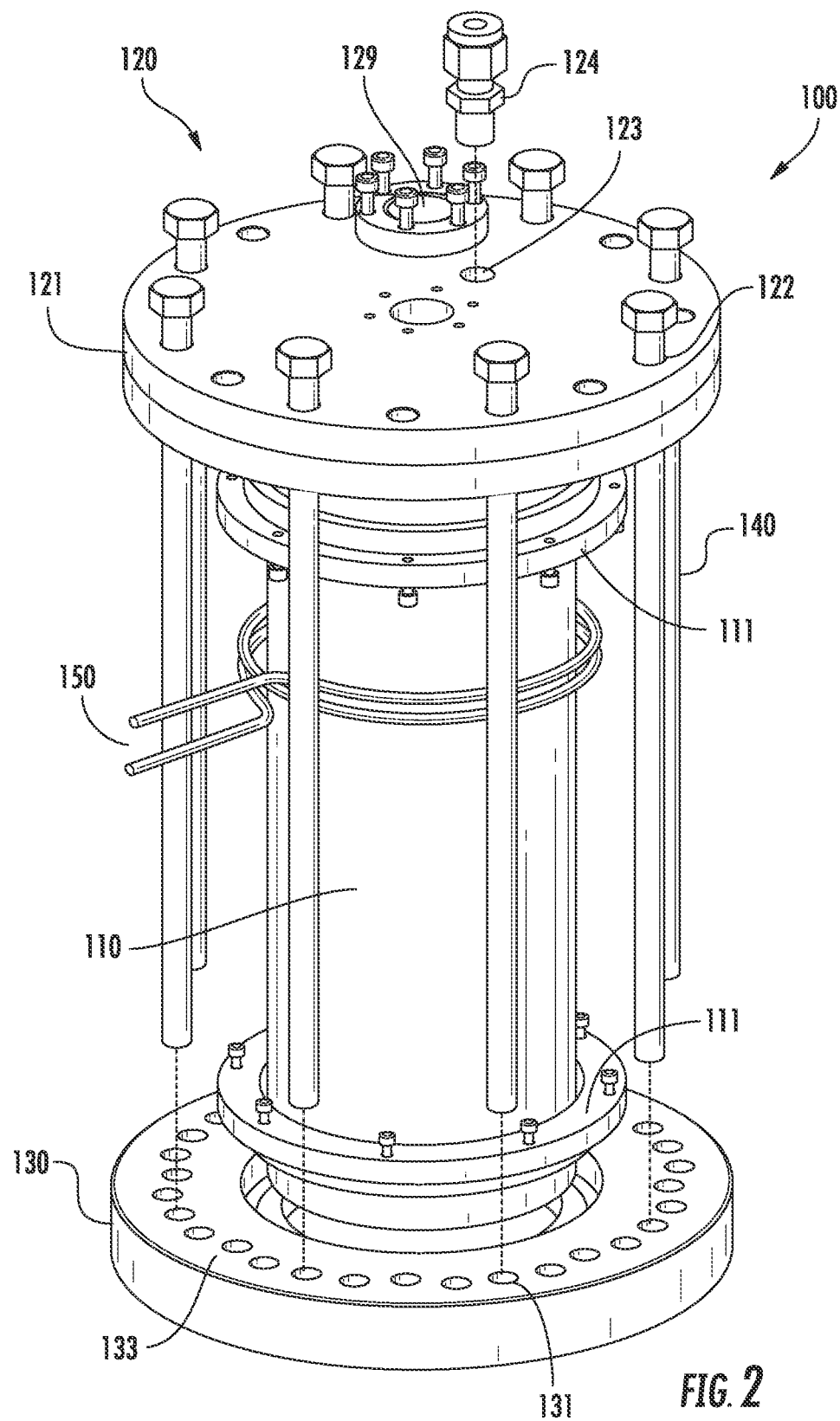
FIG. 2 shows an upper assembly according to one embodiment.

As better seen in FIG. 2, the upper assembly 100 typically includes a cylindrical tube 110, which may be made of an electrically insulating material, such as alumina. The interior of the cylindrical tube 110 is hollow and defines the upper portion of the processing chamber. The top end of the cylindrical tube 110 is attached to the chamber head 120 using a sealing mechanism 111. The chamber head 120 includes a top flange 121. In certain embodiments, a sealing mechanism 111 is disposed between top of the cylindrical tube 110 and the top flange 121 to create an airtight seal. The bottom end of the cylindrical tube 110 is in communication with a bottom flange 130. Unlike the top flange 121, the bottom flange 130 has a large central opening in its middle. The top flange 121 and the bottom flange 130 may be made of stainless steel, aluminum, nickel-plated brass or other suitable materials. In certain embodiments, a sealing mechanism 111 is disposed between bottom of the cylindrical tube 110 and the bottom flange 130 to create an airtight seal. In certain embodiments, the top flange 121 may have a plurality of holes 122 spaced along its outer circumference. Similarly, the bottom flange 130 may have an equal number of corresponding threaded holes 131 disposed therein. In certain embodiments, the chamber head 120, the cylindrical tube 110 and the bottom flange 130 are held together through the use of bolts 140. Each bolt 140 may pass through a hole 122 in the top flange 121 and continue parallel to the cylindrical tube 110 to a corresponding threaded hole 131 in the bottom flange 130. As shown in FIG. 2, the top flange 121 and the bottom flange 130 have diameters greater than that of the cylindrical tube 110. For example, the top flange 121 and the bottom flange 130 may have diameters of roughly 6 inches and 6.25 inches, respectively, while the cylindrical tube 110 has an outer diameter of roughly 3 inches. In this way, the bolts 140 that connect the top flange 121 and the bottom flange 130 may be disposed on the outside of the cylindrical tube 110. In certain embodiments, eight bolts are used to secure the upper assembly 100 together, although other embodiments are also possible and within the scope of the disclosure.

In some embodiments, the chamber head 120 may also include a gas feedthrough that passes through the top flange 121. The gas feedthrough may comprise a gas inlet 123 disposed in and passing through the top flange 121. The gas inlet 123 may be threaded and a threaded tube fitting 124 may be attached thereto, allowing a gas tube to be connected to the threaded tube fitting 124. Of course, other mechanisms to pass a processing gas into the processing chamber may also be used. The use of a threaded tube fitting 124 that passes through a gas inlet 123 in the top flange 121 is only one possible embodiment.

Figure 9:
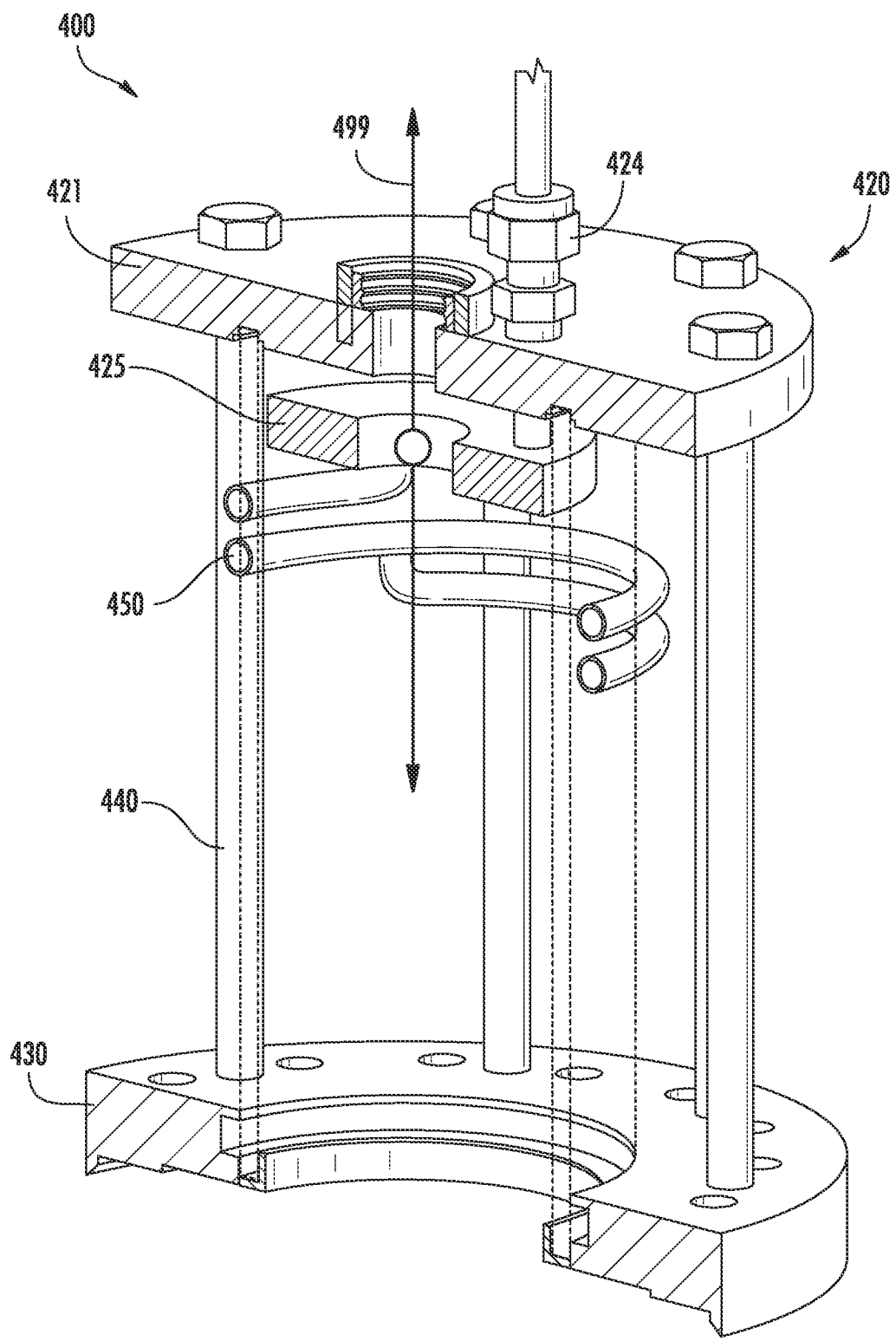
FIG. 9 shows a cross-sectional view of an upper assembly having a second adjustment mechanism.

Disposed within the processing chamber and in communication with the gas inlet 123 may be a gas showerhead 425 (see FIG. 9). The gas showerhead 425, which may be made of stainless steel, aluminum, nickel-plated brass or other suitable materials, may be attached to the underside of the top flange 121 using fasteners or interlocking geometry and serves to distribute the processing gas more uniformly throughout the processing chamber. In certain embodiments, the gas showerhead 425 resembles a traditional showerhead, having an inlet on one side (nearest the top flange 121) and a plurality of smaller outlets disposed on the opposite side (facing the processing chamber). The plurality of smaller outlets is arranged in a pattern to achieve an optimized flow of processing gas into the processing chamber. In certain embodiments, the gas showerhead 425 may be used to generate a spatially uniform flow of processing gas in the processing chamber.

In certain embodiments, the top flange 121 also comprises a central utility port 129. In certain embodiments, the central utility port 129 is used to introduce a diagnostic tool, such as a Langmuir probe or an optical diagnostic tool, such as a spectrometer. In other embodiments, the central utility port 129 may be configured as a viewport looking into the processing chamber.

The upper assembly 100 may also include one or more processing apparatus 150, which may be disposed outside the processing chamber. In certain embodiments, all or part of the processing apparatus 150 may be disposed within the processing chamber, such as in the case of a sputtering gun (see FIG. 10). The various processing apparatus 150 will be described in more detail below.

In certain embodiments, the upper assembly 100 may be about 9 inches tall and have an outer diameter of about 6.25 inches. In other embodiments, the dimensions of the upper assembly 100 may vary to better accommodate the desired processing function.

Figure 3:
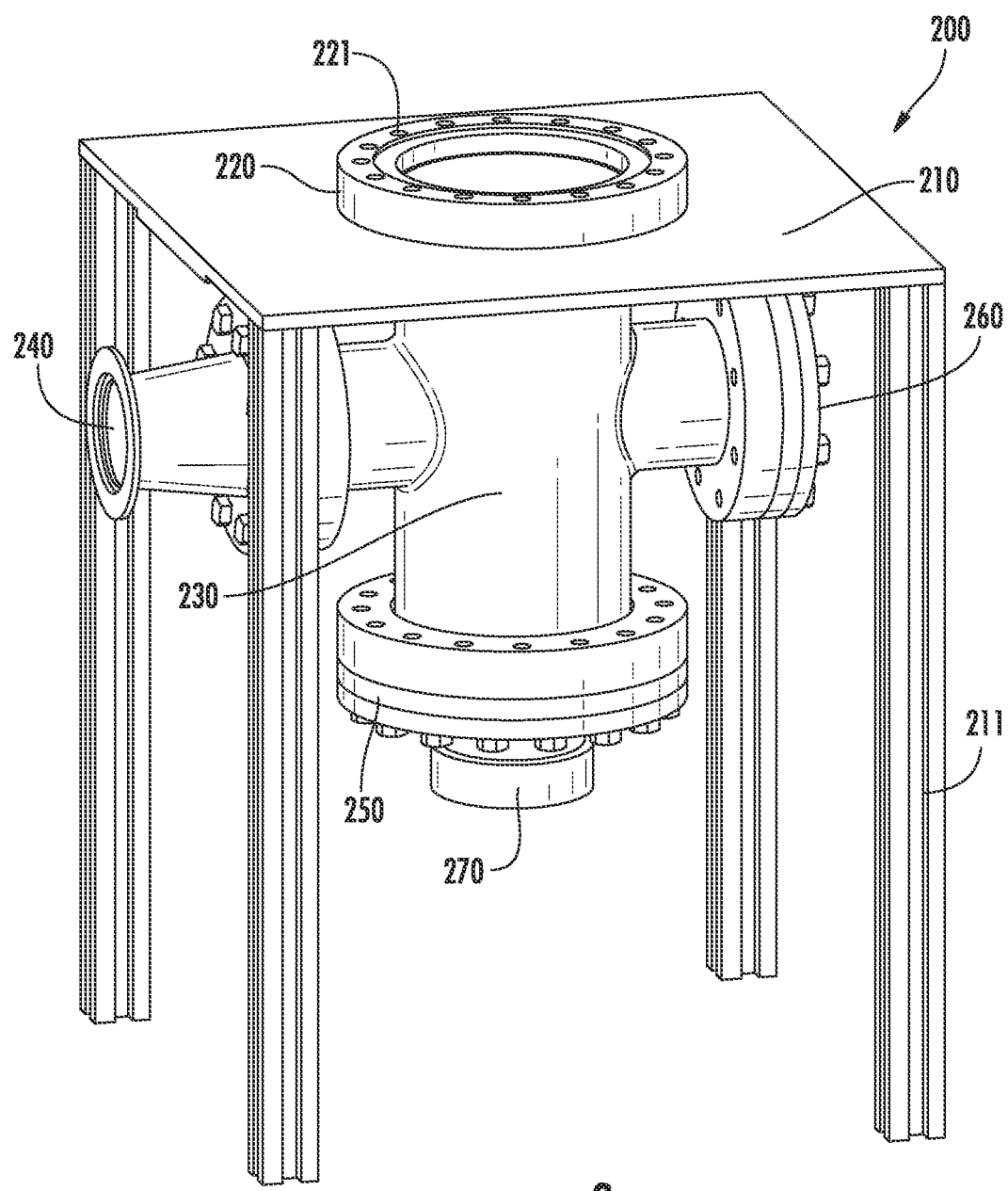
FIG. 3 shows a lower assembly according to one embodiment.

FIG. 3 shows a representative view of a lower assembly 200. The lower assembly is used to support the upper assembly 100, and also houses the various pumps and the chuck assembly.

The lower assembly 200 comprises a platform 210. The platform 210 may comprise a plurality of supports 211 which maintain separation between the top of the platform 210 and the underlying surface. The platform 210 may also be formed by an aperture and connection holes in a larger surface such as a table. A flange 220 may be disposed on the top surface of the platform 210. The flange 220 has a large central opening. The flange 220 may also have connection holes 221 therethrough, which align to the connection holes 133 in the bottom flange 130 of the upper assembly 100 (see FIG. 2). In certain embodiments, there is a knife edge-based (CF-style) seal between bottom flange 130 and flange 220. It seals by having a metal or elastomeric gasket sitting between symmetrical knife edges cut into bottom flange 130 and flange 220. The gasket forms an airtight seal between these knife edges. The sealing forces come from the weight of the upper assembly 100 and the induced force from the pressure difference between vacuum in the chamber and the atmospheric pressure outside.

A lower chamber flange manifold 230 may be disposed beneath and attached to the underside of the top surface of the platform 210. The lower chamber flange manifold 230 may be a hollow structure, where the top surface of the structure is attached to the underside of the top surface of the platform 210. The bottom surface of the structure is open. A pump port 240 may be in communication with the lower chamber flange manifold 230. In certain embodiments, the pump port 240 may be disposed along a sidewall of the structure. Vacuum pumping and pressure control equipment (not shown) may be attached to the pump port 240 to maintain the processing chamber at the desired pressures for operation, when the upper assembly 100 and chuck assembly 300 are attached to the lower assembly 200. A sample transfer flange 260 may also be in communication with the lower chamber flange manifold 230, such as on a second sidewall. Sample transfer apparatus (not shown), such a vacuum load lock system (including components such as a gate valve, a sample loading door, a vacuum port, and a linear and/or rotary motion vacuum feedthrough), may be attached to this sample transfer flange 260 to allow substrates to be loaded and unloaded from the chuck assembly 300 while maintaining vacuum pressures. In certain instances, this may be a desirable characteristic for many different micro- and nanofabrication processes.

Disposed within the bottom flange 250 is a vacuum feedthrough 270. As described in more detail below, a chuck assembly 300 may be inserted in the lower assembly 200 and is held in place by vacuum feedthrough 270. In certain embodiments, the vacuum feedthrough 270 includes multiple levels of airtight seals that allow for translational and rotational motion of the chuck assembly 300 through the vacuum feedthrough 270 while maintaining full airtightness.

Figure 4:
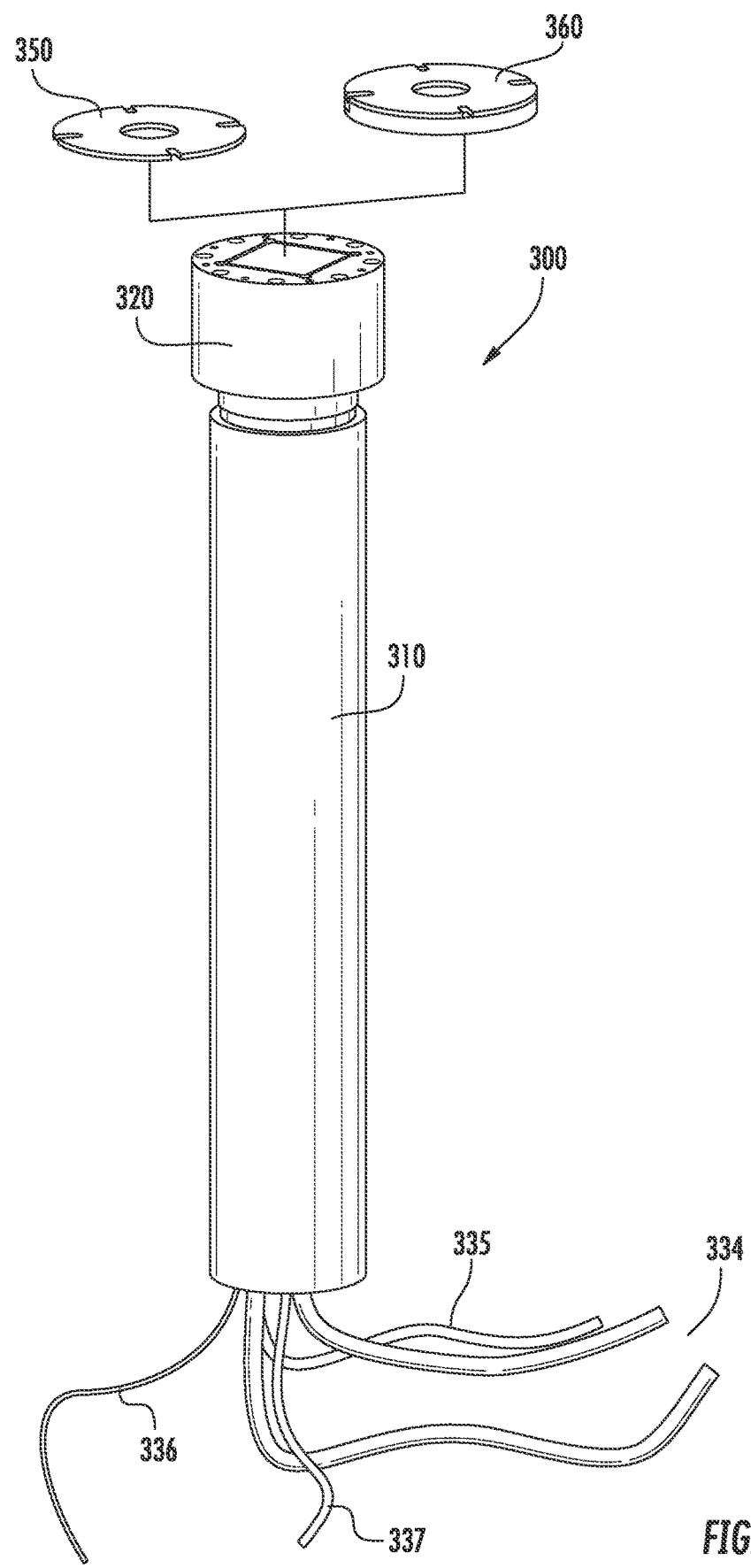
FIG. 4 shows a chuck assembly according to one embodiment.
Figure 5:
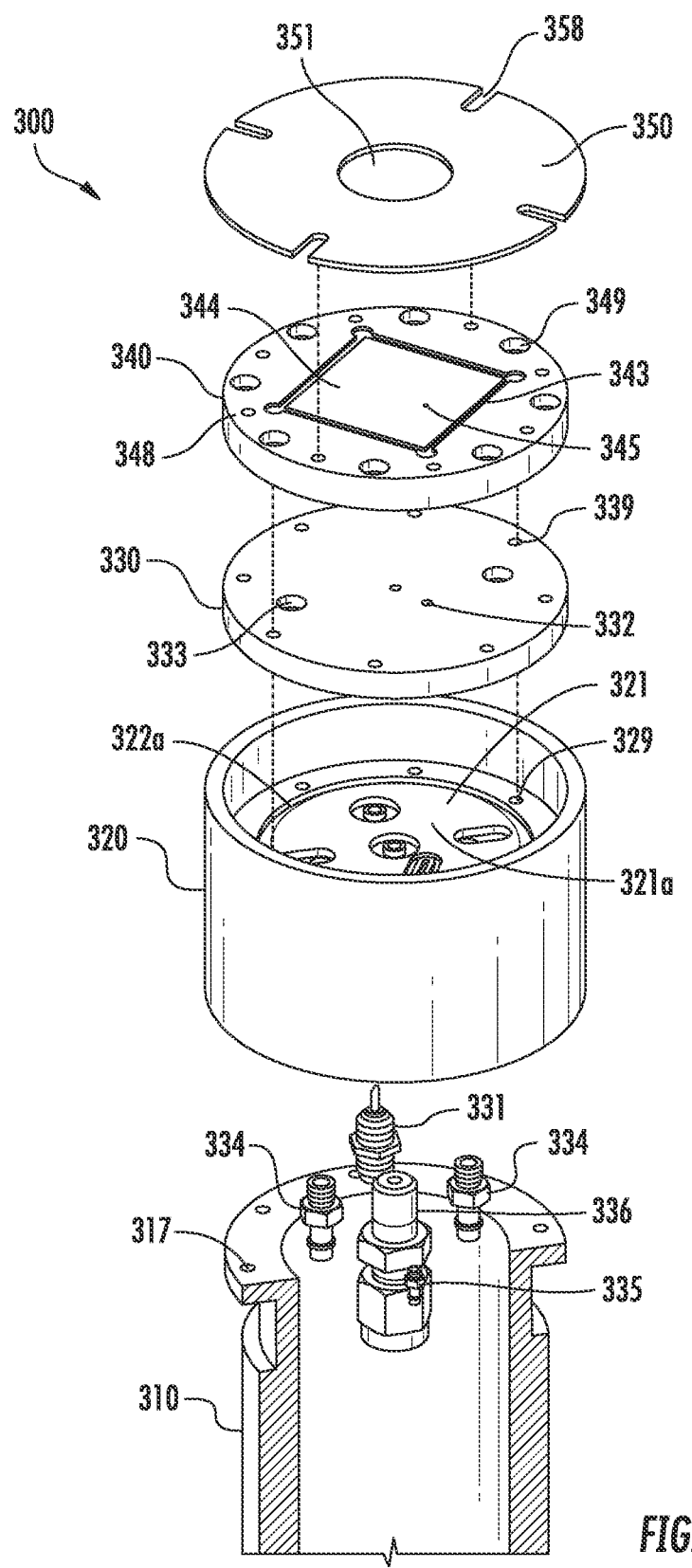
FIG. 5 shows an exploded view of the chuck assembly of FIG. 4.
Figure 6:
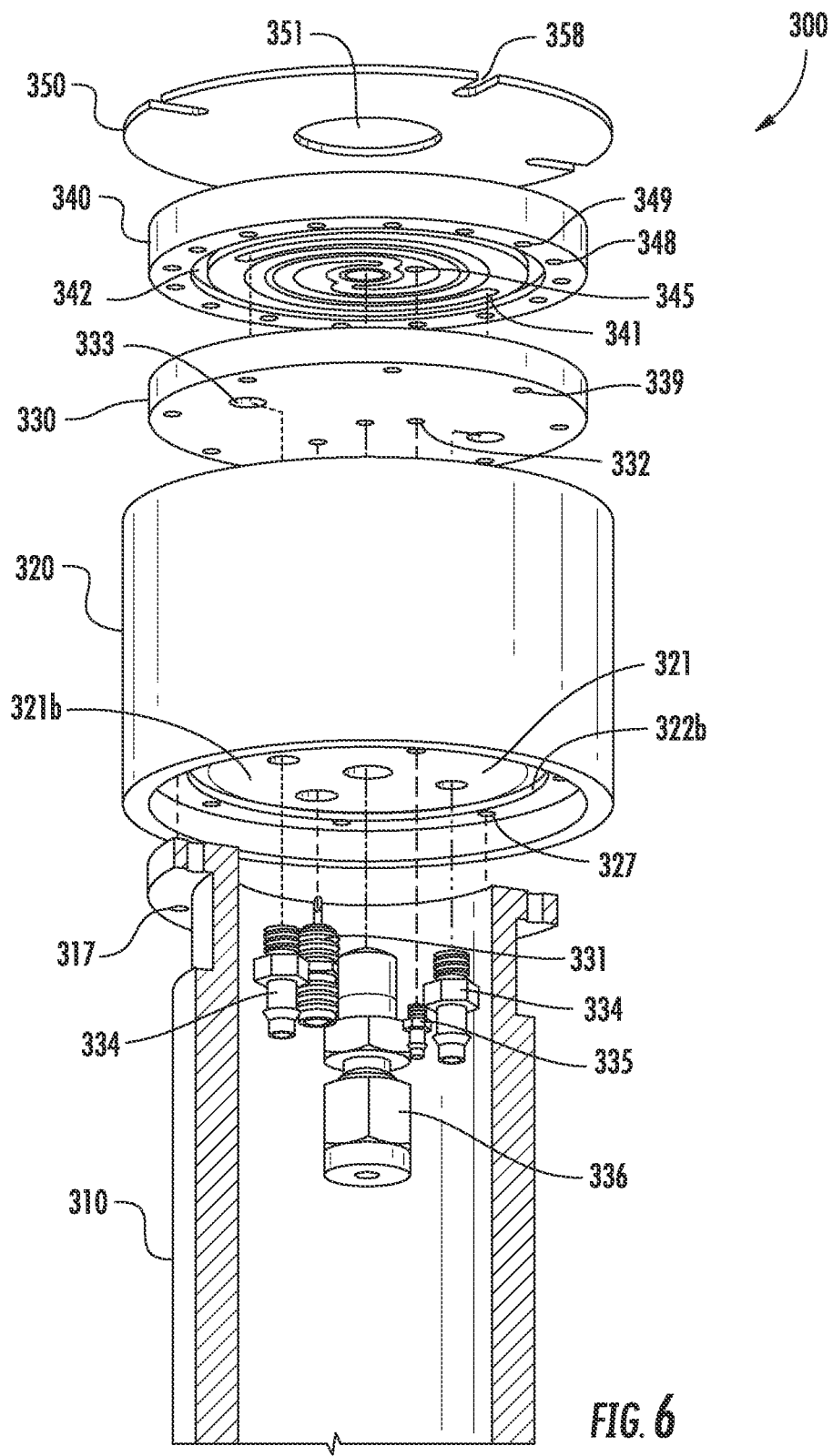
FIG. 6 shows an exploded view of the chuck assembly of FIG. 4.

FIG. 4 shows an assembled view of a chuck assembly 300 according to one embodiment. FIGS. 5-6 show exploded views of the upper portion of the chuck assembly 300 of FIG. 4. The chuck assembly 300 may be used with different wafer attachment mechanisms. FIG. 4 shows a wafer clamp 350 and a wafer carrier 360 as being interchangeable wafer attachment mechanisms. The chuck assembly 300 of FIGS. 5-6 shows the wafer clamp 350. The wafer carrier is illustrated in greater detail in FIGS. 12a-12b.

The chuck assembly 300 comprises a feedthrough tube 310. The connections to the chuck, including electrical conduit 337 and fluid connections 334, communicate through the feedthrough tube 310. The bottom open end of the feedthrough tube 310 extends downward from the vacuum feedthrough 270 (see FIG. 1) and is exposed to the exterior of the substrate processing system 10. The top end of the feedthrough tube 310 is in communication with an isolation and alignment block 320. The isolation and alignment block 320 may be constructed of an electrically insulating material, such as polyether ether ketone (PEEK), polyimide, or alumina. The isolation and alignment block 320 serves to enclose and protect the internal connections to the chuck. The isolation and alignment block 320 may be cylindrical with an interior flange 321 and a hollow interior. This interior flange 321 rests on a flange on the top surface of the feedthrough tube 310. The interior flange 321 may have along its circumference a plurality of connection holes 327 and 329, where the connection holes 327 are on the bottom face (321b) of the interior flange 321, and the connection holes 329 are on the top face (321a) of the interior flange 321. These connection holes 327 and 329 may be communication with one another. The feedthrough tube 310 may have connection holes 317 that connect with fasteners to the connection holes 327 on the bottom face 321b of the interior flange 321. O-ring grooves 322a, 322b may be included on both the top face 321a and bottom face 321b, respectively, of the interior flange 321 to provide an airtight seal between the interior region of the chuck assembly 300 and the processing chamber. Other embodiments may include additional seals inside of the O-ring grooves 322a, 322b to isolate fluids and other connections from one another and the processing chamber.

Disposed within the hollow interior of the isolation and alignment block 320 and above the interior flange 321 may be a coupling plate 330 and an upper chuck piece 340. In certain embodiments, the coupling plate 330 may comprise at least one electrical connection, which allows an electrical signal to be applied to the coupling plate 330. In certain embodiments, a connector 331, such as an SMA connector, is disposed on the interior flange 321 and provides an electrical connection with the coupling plate 330. The connector 331 may be attached to an external power supply (not shown) via an electrical conduit 337 so as to apply an electrical signal to the coupling plate 330. In certain embodiments, the electrical signal may be a time-varying, or RF voltage. In other embodiments, the electrical signal may be a constant or pulsed DC voltage. The coupling plate 330 may be constructed of an electrically conductive material, such as aluminum. The coupling plate 330 may rest on the interior flange 321 of the isolation and alignment block 320, which in turn rests on the flange on the top surface of the feedthrough tube 310. The coupling plate 330 may have a plurality of connection holes 339 around its circumference. These connection holes 339 may be arranged to match with connection holes 349 and 329 found on the upper chuck piece 340 and the isolation and alignment block 320, respectively. These matched connection holes 329, 339, 349 allow the three components to be connected to one another via fasteners.

Disposed on the coupling plate 330 is the upper chuck piece 340. The upper chuck piece may include one or more internal conduits 341 through which a fluid, such as water, may pass. These internal conduits 341 may be in communication with fluid feedthrough conduits 333 in the coupling plate 330, which in turn, are in communication with fluid connections 334. These internal conduits 341 are fabricated into the underside of the upper chuck piece 340, so as to be exposed on the underside of the upper chuck piece 340. These internal conduits 341 may exist in a dual spiral configuration, such that an inlet channel is disposed adjacent to an outlet channel. The upper chuck piece 340 is then attached to the coupling plate 330, such that the top surface of the coupling plate 330 forms a wall of internal conduits 341. An O-ring (not shown) may be disposed in the O-ring recess 342 between the upper chuck piece 340 and the coupling plate 330. A fluid, such as water, may be pumped into one of fluid connections 334, travel through a first of the fluid feedthrough conduits 333 in the coupling plate 330 and circulate through the internal conduits 341 of the upper chuck piece 340. The water then exits the internal conduits 341 of the upper chuck piece 340, passes through a second of the fluid feedthrough conduits 333 in the coupling plate 330 and passes into the second of the fluid connections 334. Like the coupling plate 330, the upper chuck piece 340 may be constructed of a conductive metal, such as aluminum. Also disposed within the chuck assembly 300 may be additional conduits that provide other connections needed for a particular application. Shown in FIGS. 4-6 is the gas connection 336, which is used to provide a heat transfer medium, such as, for example, helium or another gas, to the volume between the substrate and the upper chuck piece 340. Also shown in FIGS. 4-6 is the sensor connection 335, which may be used to monitor different characteristics of the chuck assembly 300, such as the temperature or the DC potential. These connections and the associated conduits passing through one or more pieces of the chuck assembly 300 (e.g. the isolation and alignment block 320, the coupling plate 330, and the upper chuck piece 340) may require additional part geometry or seals to provide appropriate isolation from the other connections. This additional geometry or seals may be readily determined and understood by a person of ordinary skill in the art.

Like the coupling plate 330, the upper chuck piece 340 may comprise connection holes 349 disposed along its circumference. In the embodiment shown in FIGS. 5-6, the connection holes 329 in the isolation and alignment block 320 may be threaded so that fasteners may be inserted through both the connection holes 349 in the upper chuck piece 340 and the connection holes 339 in the coupling plate 330, to secure the three components (isolation and alignment block 320, coupling plate 330, and upper chuck piece 340) together. In some embodiments, the upper chuck piece 340 and the coupling plate 330 are also independently secured together with fasteners or interlocking geometry.

In one particular embodiment of the chuck assembly shown in FIGS. 5-6, a gas passage 345 may be disposed in the upper chuck piece 340. Gas conduits 332 may exist in the coupling plate 330 to allow communication between the gas connection 336 and the gas passage 345. In this way, a source of gas, such as, for example, helium, may be connected to gas connection 336. This gas then flows through the gas connection 336 to the gas conduits 332 in the coupling plate 330. The gas travels through the gas conduits 332 and into the gas passage 345 in the upper chuck piece 340. The gas then exits the top surface of the upper chuck piece 340.

A wafer attachment mechanism is then disposed on top of the upper chuck piece 340. In certain embodiments, such as is shown in FIGS. 5-6, disposed on top of the upper chuck piece 340 may be a wafer clamp 350. This wafer clamp 350 may be constructed of an electrically insulating material, such as alumina. The wafer clamp 350 may be secured to the upper chuck piece 340 using fasteners via matching connection holes 358 and 348 on the wafer clamp 350 and the upper chuck piece 340, respectively. The wafer clamp 350 may contain one or more apertures 351 that define particular areas of the substrate that will be exposed to the processing environment. During operation, the substrate rests between the wafer clamp 350 and the upper chuck piece 340. An O-ring recess 343 may be disposed on the top surface of the upper chuck piece 340 to provide an airtight seal between the substrate and upper chuck piece 340. This seal may prevent any fluids flowed through conduits extending through the upper chuck piece 340 from communicating with the greater processing chamber. For example, in certain embodiments, a gas is flowed to the volume between the substrate and the upper chuck piece 340 (through gas passage 345) to serve as a heat transfer medium. A shallower alignment recess 344 may also be disposed on the top surface of the upper chuck piece 340 to provide spatial registration for the substrate.

Figure 12A:
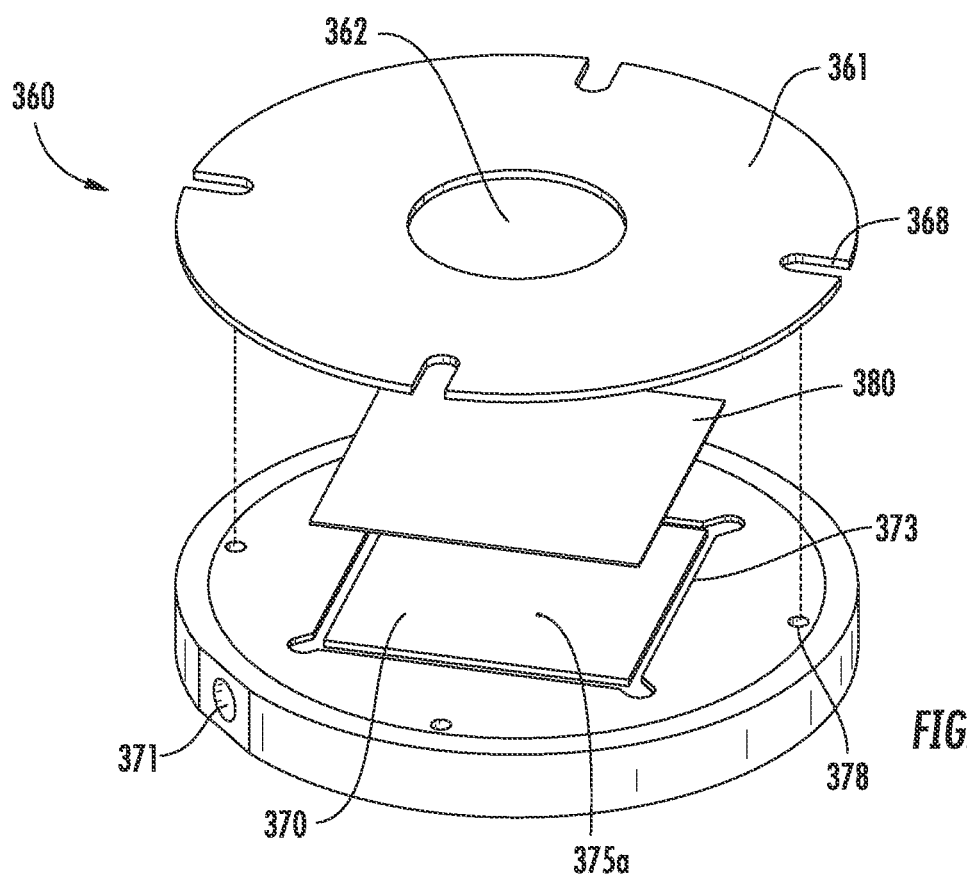
FIGS. 12a-12b shows a top view and a bottom view, respectively, of a wafer carrier assembly according to one embodiment.
Figure 12B:
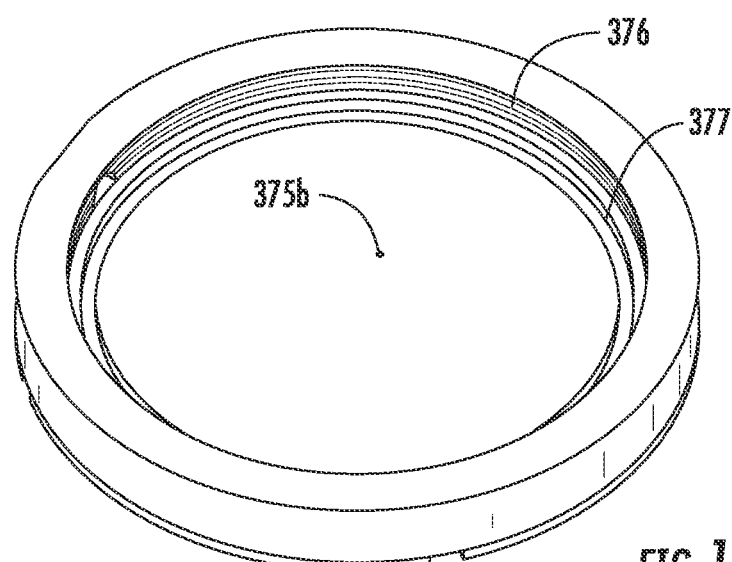

In another embodiment, shown in FIGS. 12a-12b, a wafer carrier 360 may be disposed on top of the upper chuck piece 340. FIG. 12a shows a top view, while FIG. 12b shows a bottom view of the wafer carrier 360. This wafer carrier 360 may include a substrate holder 370 and an insulating clamp 361 to secure the substrate 380 to the carrier and may contain one or more apertures 362 to define particular areas of the substrate 380 that will be exposed to the processing environment. The insulating clamp 361 may be secured to the substrate holder 370 using fasteners via matching connection holes 368 and 378. An O-ring recess 373 provides an airtight seal between the underside of the substrate 380 and the substrate holder 370. The wafer carrier 360 may also include a fastening and sealing mechanism 376 and 377 to removably couple to the upper chuck piece 340 in an airtight manner. For example, the wafer carrier may clip onto the upper chuck piece 340. In other embodiments, the upper chuck piece 340 and the substrate holder 370 may comprise threads, such that the substrate holder 370 may be screwed onto the upper chuck piece 340. In the airtight region inside of the sealing mechanism 377, one or more conduits 375a, 375b may be included to interface with connections passing through the upper chuck piece 340. In one particular embodiment of the chuck assembly shown in FIGS. 5-6, the gas passage 345 in the upper chuck piece 340 may interface with the conduits 375a, 375b to provide the volume between the substrate holder 370 and the substrate 380 with a connection to the gas provided through gas connection 336. The wafer carrier 360 may also include geometry or connection holes 371 that allow it to be easily captured by a sample transfer mechanism. This sample transfer mechanism may originate from a sample transfer assembly (such as a load lock system) that is attached to the system through the sample transfer flange 260.

To create the substrate processing system, the assembled chuck assembly 300 may be installed in the lower assembly 200 by sliding the chuck assembly through the flange 220 and through the vacuum feedthrough 270. As described above, several connections may exit through the open bottom end of the feedthrough tube 310. After the chuck assembly 300 has been attached to the lower assembly 200, the upper assembly 100 may be placed in the lower assembly 200. Geometry on the underside of flange 130 or top side of flange 220 may be used to spatially align the upper and lower assembly to one another. Fasteners may be used to secure the bottom flange 130 of the upper assembly 100 and the flange 220 of the lower assembly 200 to the platform 210.

A power supply may then be connected to the connector 331 via electrical conduit 337, fluid sources may be connected to fluid connections 334, gas connections 336, and tube fitting 124 and instrumentation may be connected to sensor connection 335. Vacuum pumping and pressure control equipment (not shown) may be attached to the pump port 240 to maintain the processing chamber at the desired pressures for operation. A sample transfer assembly (not shown) may then be attached to the sample transfer flange 260. Suitable connections may then be made to the processing apparatus 150 of the upper assembly 100. After completion of this assembly process, the substrate processing system 10 is ready for operation.

As is well known in the art, there are many different processes that may be performed on a substrate in a vacuum chamber such as the one described above. These include ion implantation, etching, deposition, sputtering, amorphization, and others. Additionally, these processes may require different configurations. For example, in certain embodiments, the substrate or processing chamber may be heated. In other embodiments, the substrate or processing chamber may be cooled. In certain embodiments, a pulsed bias voltage may be applied to the substrate. In other embodiments, an RF bias voltage may be applied to the substrate. In yet other embodiments, it may be advantageous to rotate the substrate during processing. In yet other embodiments, it may be beneficial to monitor one or more parameter on the substrate or within the processing chamber during processing.

Advantageously, the present substrate processing system 10 comprises a plurality of modular, interchangeable parts enabling all of these processes to be performed, at a plurality of different operating conditions.

First, the chuck assembly 300, as described above, may include a coupling plate 330 and an upper chuck piece 340. In the embodiment shown in FIGS. 4-6, the coupling plate 330 is electrically connected to a connector 331 using an electrical conduit to allow electrical signals to be applied to it. These electrical signals may be pulsed DC voltages, time varying or RF voltages, or any other suitable voltage. The upper chuck piece 340 has internal conduits 341 to allow the circulation of a fluid. In certain embodiments, this is done using water to cool the substrate. However, if desired, a colder fluid, shown as cooled nitrogen, may be flowed through the internal conduits 341 to further reduce the temperature of the substrate. In certain embodiments, the coupling plate 330 also has gas conduits 332 to allow a heat transfer medium to communicate with the underside of the substrate. In these embodiments, the upper chuck piece 340 comprises gas passages 345 to allow a heat transfer medium to communicate with the underside of the substrate. Further, different wafer attachment mechanisms may be used. For example, in certain embodiments, the substrate may be attached directly to the top surface of the upper chuck piece 340 using a wafer clamp 350. In certain embodiments, the wafer is disposed within a wafer carrier 360. This wafer carrier is then disposed on top of the upper chuck piece 340.

Further, in certain embodiments, the upper chuck piece 340 and coupling plate 330 of FIGS. 4-6 may be replaced with a set of different components, which includes resistive heaters disposed therein. In this embodiment, the fluid connections 334 may be replaced with one or more electrical connections, which provide the power to actuate the resistive heaters within the upper chuck piece 340. These resistive heaters may allow the substrate to be heated to several hundred degrees (C.).

Thus, in certain embodiments, the power supply used to power the coupling plate 330 may be changed to accommodate different operating parameters. In certain embodiments, the fluid passed through the internal conduits 341 of the upper chuck piece 340 may be varied to change the temperature of the substrate during processing. In certain embodiments, a heat transfer medium may be supplied to the volume between the underside of the substrate and the upper chuck piece 340. In yet other embodiments, the upper chuck piece 340 and coupling plate 330 may be exchanged for an interchangeable part that replaces the internal conduits 341 with resistive heaters. In certain embodiments, parameters, such as temperature, DC potential, pressure, or others, may be monitored using the sensor connection 335.

In certain embodiments, the chuck assembly 300 may also include a rotary actuator, which allows the substrate to rotate as it is being processed.

Further, in certain embodiments, the feedthrough tube 310 may be sufficiently long so as to allow adjustment of the height of the substrate within the processing chamber. For example, by varying where the feedthrough tube 310 sits relative to the vacuum feedthrough 270, the total height of the chuck assembly 300 within the lower assembly 200 may be adjusted. Thus, the position of the substrate within the processing chamber can also be easily adjusted, based on desired process conditions. In certain embodiments, the ability to vary the height of the chuck assembly 300 within the lower assembly 200 may also enable loading and unloading of substrates via the sample transfer flange 260. When coupled with an appropriate sample transfer assembly (such as a load lock system), the top of the chuck assembly 300 may be adjusted to a height near the middle of the sample transfer flange 260, and mechanisms included in the sample transfer assembly (such as a linear and/or rotary motion vacuum feedthrough) may load and unload a wafer carrier 360. The height of the chuck assembly may then be readjusted to continue with the next step of the processing sequence.

Figure 7:
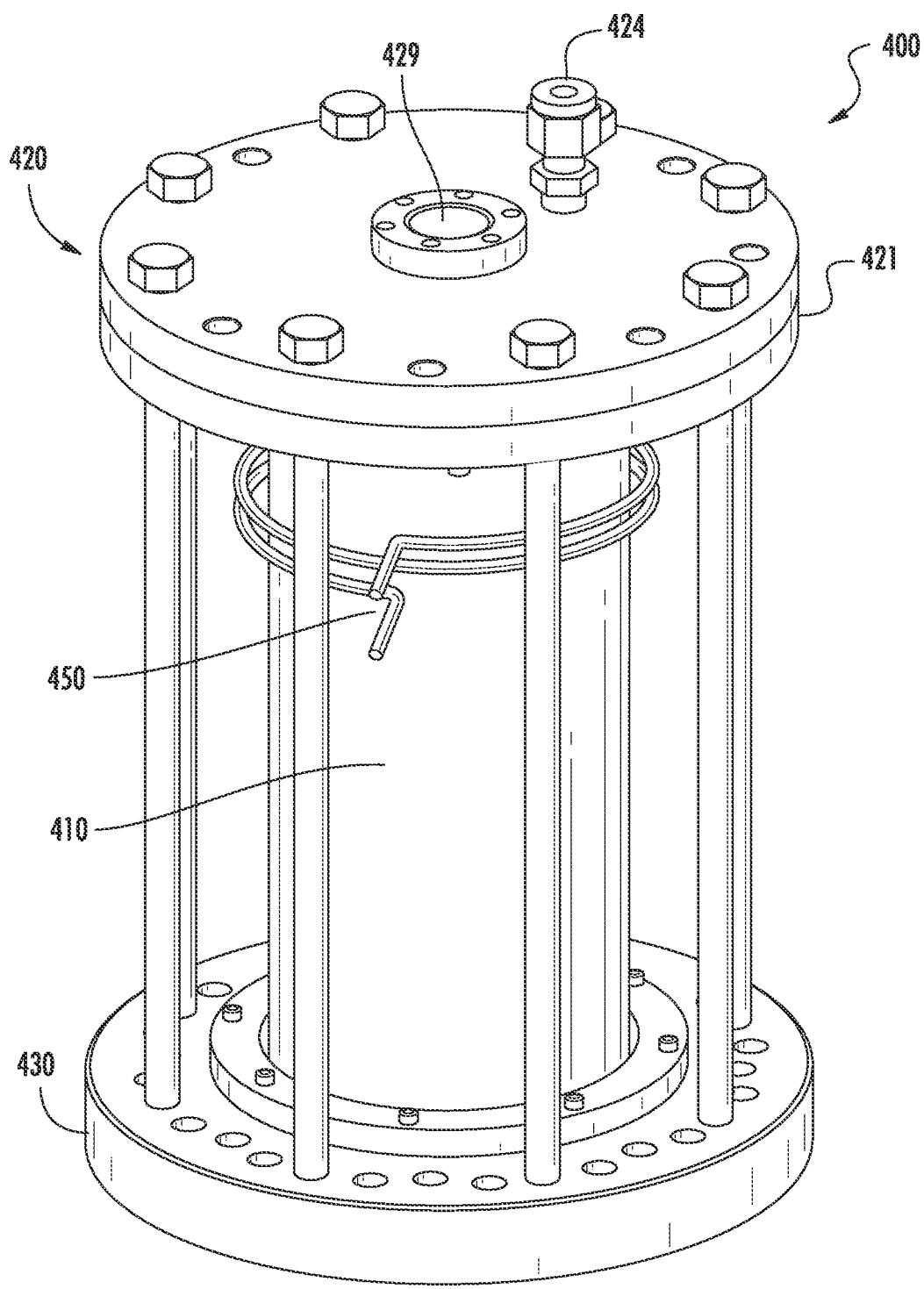
FIG. 7 shows an upper assembly according to one embodiment.

Additionally, the present substrate processing system 10 allows the use of different upper assemblies 100, each of which may be configured for a specific purpose. FIG. 7 shows a first embodiment of an upper assembly, similar to the one shown in FIG. 1. This upper assembly may be referred to as an etching upper assembly 400. In this configuration, the etching upper assembly 400 includes a chamber head 420, which comprises a top flange 421, which includes a central utility port 429 and a threaded tube fitting 424. The central utility port 429 may be used to introduce a diagnostic tool or as a viewport. The etching upper assembly 400 also includes a hollow cylindrical tube 410, which is made of an electrically insulating material, such as alumina. A bottom flange 430 is also provided, and bolts 440 are used to hold together the chamber head 420, the cylindrical tube 410 and the bottom flange 430, as described with reference to FIG. 2. The top flange 421 and bottom flange 430 may be metal components, such as stainless steel.

In this embodiment, a helical coil 450, made of a conductive material, is disposed around the outside of the cylindrical tube 410. While FIG. 7 shows two rotations of the helical coil 450 about the cylindrical tube 410, the disclosure is not limited to this configuration. Any number of rotations may be employed.

A power supply (not shown) is in communication with this helical coil 450. The power supply may supply an RF voltage to the helical coil 450, which may be used to inductively couple energy into the processing chamber. This inductively coupled energy causes the gas that is introduced through the threaded tube fitting 424 to become a plasma.

Figure 8:
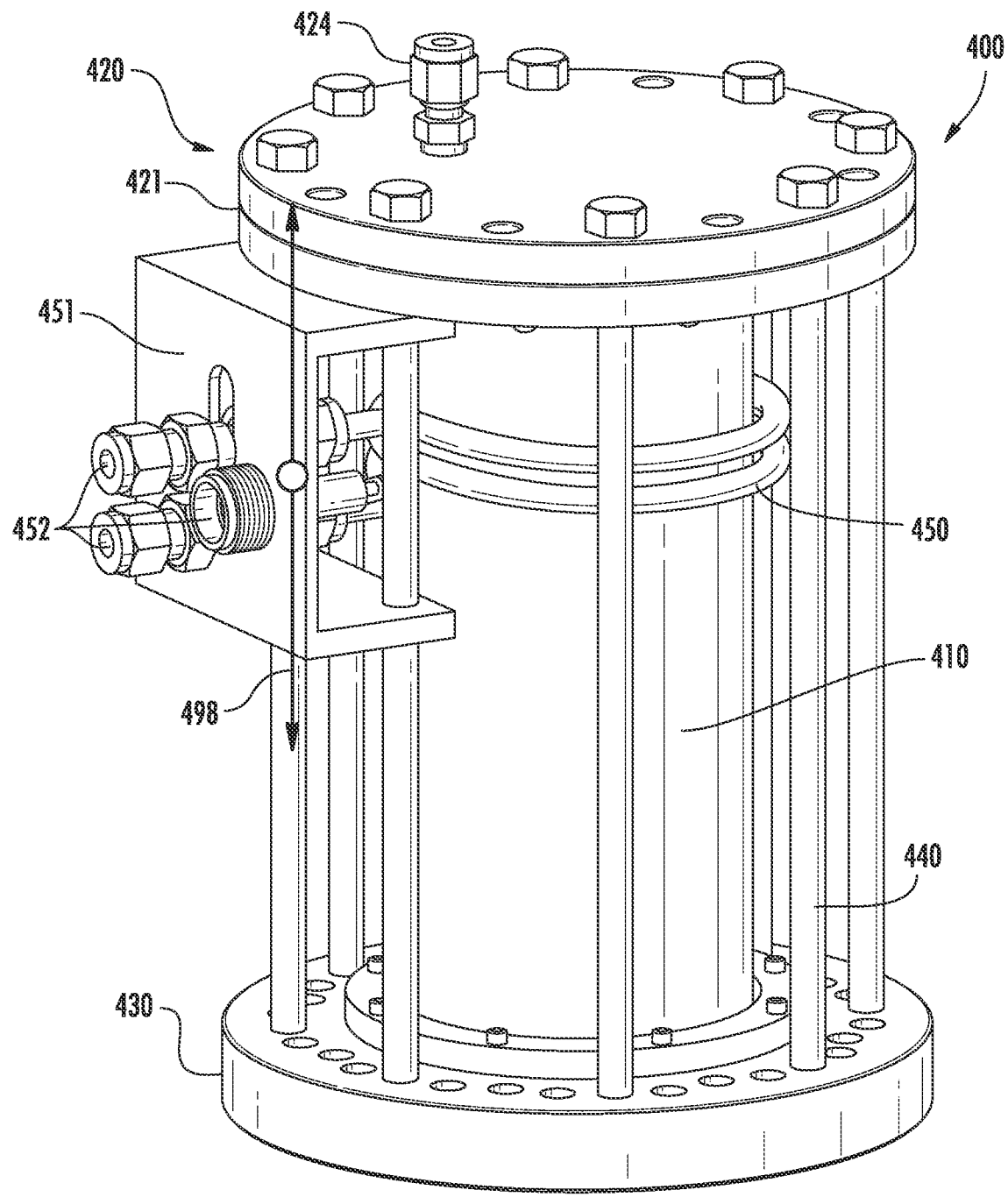
FIG. 8 shows an upper assembly having an adjustment mechanism.

In certain embodiments, the helical coil 450 may be translated vertical along the cylindrical tube 410. For example, the helical coil 450 may be movably attached to one or more of the bolts 440, such that the helical coil 450 may be moved by adjustment of the attachment point to the bolts 440. FIG. 8 shows an embodiment where the helical coil 450 may be moved vertically along the outside of the cylindrical tube 410. The arrow 498 shows the axis of motion for the helical coil 450. The position of the helical coil 450 may be controlled by a coil connecting assembly 451. This coil connecting assembly 451 may be secured to the etching upper assembly 400 using one or more of the bolts 440 that connect the cylindrical tube 410, top flange 421, and bottom flange 430. One or more coil connections 452 may also be included on the coil connecting assembly 451 to better facilitate the connection of power sources and/or other cooling, measurement, or sensing apparatus necessary for the particular process being performed.

The chamber head 420 may also comprise a gas showerhead 425, which is in communication with the gas connection that passes through the threaded tube fitting 424. In certain embodiments, the gas showerhead 425 is directly connected to the underside of the top flange 421. In other embodiments, the gas showerhead 425 may also be vertically translated within the cylindrical tube 410 by moving a straight tube 426 in communication with the gas showerhead 425 through the tube fitting 424, as shown by arrow 499 in FIG. 9. For example, in certain embodiments, it may be beneficial to introduce the gas a distance away from the substrate. In these embodiments, the gas showerhead 425 may be disposed near the top flange 421. In other embodiments, there may be advantages to introducing the gas closer to the substrate. In these embodiments, the gas showerhead 425 may be moved further from the top flange 421. As the helical coil 450 may also be vertically translated, a coordinated positioning of the gas showerhead 425 and the helical coil 450 may be used to optimize the process to be performed on the substrate.

While the upper assembly of FIG. 7 is referred to as an etching upper assembly, if is noted that other processes may also be performed with this upper assembly. For example, in certain embodiments, deposition or ion implantation may be performed using this upper assembly. For example, the selection of the gas that is introduced into the processing chamber may cause the substrate to be etched. However, selecting a different gas may cause deposition. Further, the application of a voltage to the coupling plate 330 may accelerate ions toward the substrate, causing implantation.

Figure 10:
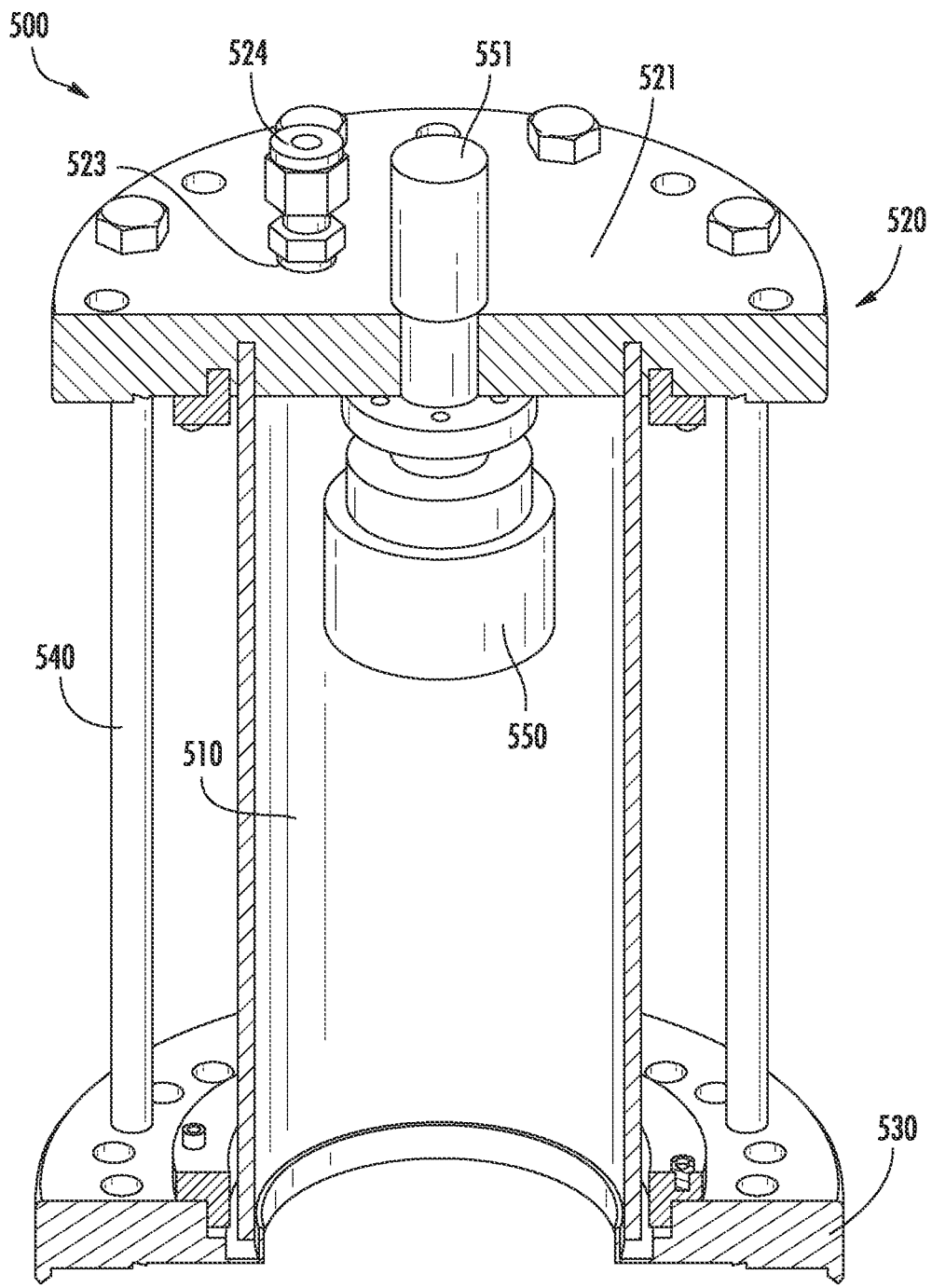
FIG. 10 shows an upper assembly according to another embodiment.

FIG. 10 shows a second embodiment of an upper assembly that may be used with the lower assembly shown in FIG. 3. In this embodiment, the upper assembly is used as a sputtering upper assembly 500. The sputtering upper assembly 500 includes a chamber head 520, which comprises a top flange 521 and a sputtering gun 550. The chamber head 520 may also include a gas inlet 523 and fitting 524 that may allow process gas into the chamber. An airtight connecting port 551 is disposed on the top flange 521 and is in communication with the sputtering gun 550. This airtight connecting port 551 may be used to provide any power and/or control signals required to operate the sputtering gun 550. Like the other embodiments, the sputtering upper assembly 500 also comprises a hollow cylindrical tube 510 and a bottom flange 530. As with other embodiments, the cylindrical tube 510 may be an electrically material, such as alumina. Further, the chamber head 520, the cylindrical tube 510 and the bottom flange 530 may be connected using bolts 540, as described in the previous embodiments. This sputtering upper assembly 500 may be used to deposit metals and insulators on a substrate.

Figure 11:
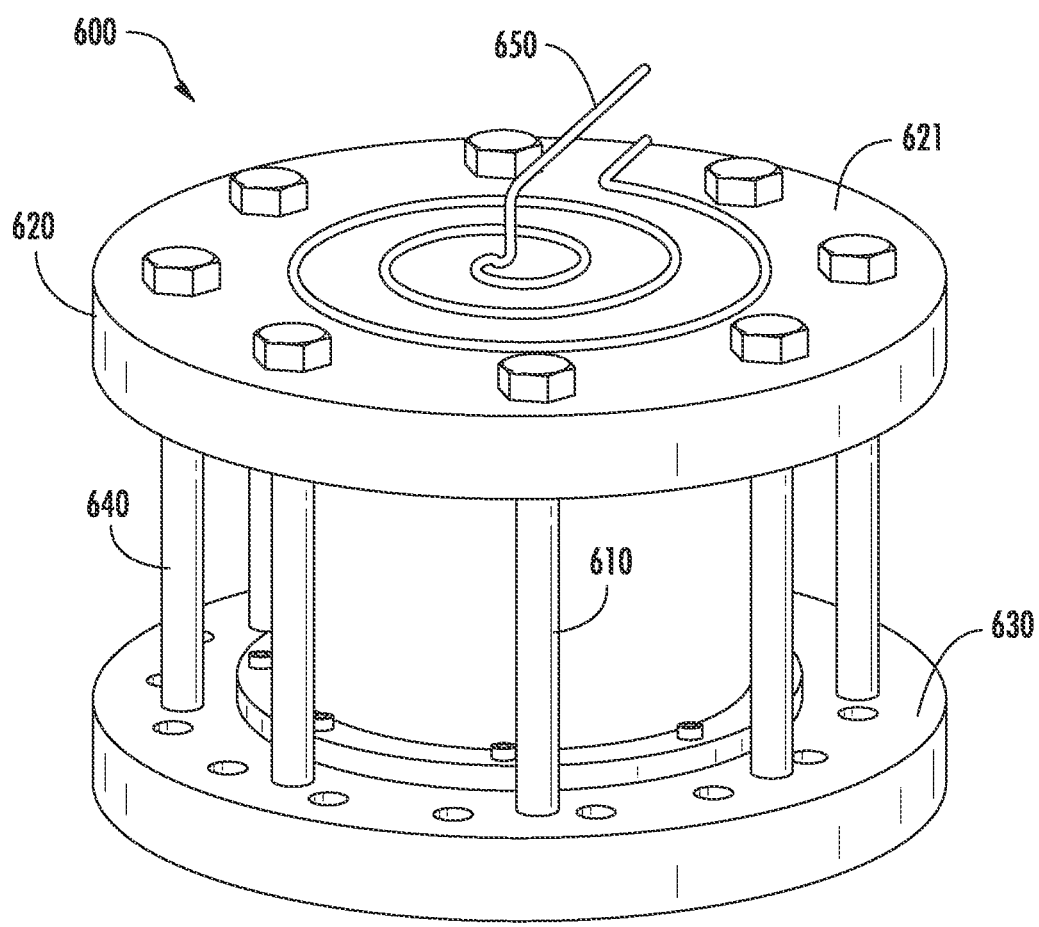
FIG. 11 shows an upper assembly according to another embodiment.

FIG. 11 shows another embodiment of an upper assembly that may be used with the lower assembly shown in FIG. 1. In this embodiment, the upper assembly is used as a deposition upper assembly 600. The deposition upper assembly 600 includes a chamber head 620. Unlike other upper assemblies, the top flange 621 of the chamber head 620 may be entirely or partially constructed from a dielectric material. Disposed on the dielectric portion of the top flange 621 is a planar coil 650, which may be circularly wound. This planar coil 650 may be in connection with a power supply (not shown), which provides a RF voltage to the planar coil 650. Like the embodiment of FIG. 7, this RF voltage induces energy within the processing chamber, which is transmitted through the chamber head 620. The deposition upper assembly 600 also includes a hollow cylindrical tube 610, which is disposed between the chamber head 620 and the bottom flange 630. As with the other embodiments, bolts 640 may be used to attach these components. In this embodiment, the energy is coupled through the top of the processing chamber. Consequently, in some embodiments, the deposition upper assembly 600 may be shorter in height than other upper assemblies so that the coupled energy is near the substrate. Although not shown, the deposition upper assembly 600 also comprises a gas inlet to allow the introduction of gas to the processing chamber. This gas inlet may be disposed on the top flange 621.

Each of the upper assemblies described herein share a common attribute, which is the bottom flange 430, 530, 630. This bottom flange is dimensioned to interface with the flange 220 of the lower assembly 200 and provide an airtight seal between the two assemblies. In other words, this bottom flange serves as a standard interface that is used by all upper assemblies.

Further, as described above, the bottom flange of the upper assemblies and the flange 220 of the lower assembly 200 all have a central opening passing therethrough. Consequently, the top portion of the processing chamber, which is defined by the top flange and cylindrical tube of the upper assembly, is in communication with the bottom portion of the processing chamber, which includes the chuck. The size of the central opening in these flanges may vary, however, in most embodiments, it may be at least as wide as the diameter of the top portion of the chuck assembly 300.

Further, FIG. 1 shows the chuck assembly extending above the top of the flange 220 and extending into the top portion of the processing chamber. In this way, the substrate is disposed above the interface between the upper assembly and the lower assembly, such that the fabrication processes occur within the processing chamber defined by the cylindrical tube. However, in other embodiments, the chuck assembly 300 may be further recessed in the lower assembly 200, such that the substrate is disposed below the interface between the upper assembly and the lower assembly. In yet other embodiments, the substrate may be elevated to be closer to the chamber head. These adjustments can be made by varying where the feedthrough tube 310 is attached to the vacuum feedthrough 270.

The disclosure describes a substrate processing system, specifically designed to handle smaller sized substrates. Advantageously, the system is designed with modular, interchangeable parts, allowing a number of different substrate processing processes to be performed using the same set of components.

More specifically, the lower assembly 200 may be considered universal, in that it may be used with a variety of different chuck assemblies and upper assemblies. The lower assembly provides a platform 210, a pump port 240 to allow the evacuation of air from the assembled system and, optionally, a sample transfer flange 260 that allows for loading and unloading of substrate while maintaining vacuum pressures. Additionally, the lower assembly includes a predetermined interface, which in these embodiments, comprises a flange, namely the flange 220. All of the various upper assemblies attach to the lower assembly 200 using this predetermined interface. Therefore, as long as each upper assembly includes the requisite interface (i.e. a flange adapted to mate with the flange 220), it may be used with the lower assembly 200.

Furthermore, the lower assembly 200 includes a vacuum feedthrough 270, which can be used to receive a chuck assembly. Again, as long as a chuck assembly includes a feedthrough tube 310 having the requisite diameter, it may be installed in the vacuum feedthrough 270 and used with the lower assembly 200.

Thus, the lower assembly 200 defines two predefined interfaces: a first interface for all upper assemblies and a second interface for all chuck assemblies. In certain embodiments, a third standard interface for sample transfer mechanisms is also provided. By providing these standard interfaces, a plurality of different fabrication tools may be created using this single lower assembly.

The upper assemblies all share a common predefined interface, which is the bottom flange. By providing this common predefined interface, new upper assemblies can readily be created which can utilize the same lower assembly, reducing space and cost requirements. For example, it may be later determined that an upper assembly that provides both a helical coil (as shown in FIG. 7) and a planar coil (as shown in FIG. 11) may be beneficial, or that additional apparatus, such as magnets, may be added to an upper assembly to provide additional functionality or performance improvements. In another example, multiple similar or identical upper assemblies may be used to perform similar or identical processes but on substrates with differing material compositions or initial conditions. Thus, a level of isolation may be achieved that may reduce undesirable cross-contamination between upper assemblies. This is often a major concern in both development and production of micro- and nanoscale devices. Upper assemblies such as these can be readily adapted to the present system simply by utilizing the same bottom flange as the other upper assemblies.

Further, while all of the upper assemblies described here include a hollow cylindrical tube and a chamber head, which are all secured to the bottom flange using bolts, this is not necessary for all embodiments. For example, the upper assembly may have a shape that is different than a cylinder, as long as the bottom flange of the upper assembly matches that used on the lower assembly.

As noted above, the lower assembly 200 also provides a standard interface for chuck assemblies. In other words, completely different chuck assemblies 300 may be used with the lower assembly 200, as long as they share an appropriately sized feedthrough tube 310. Similarly, the sample transfer flange 260 may be used with different sample transfer assemblies, or even other assemblies containing such things as additional diagnostic or measurement instrumentation, as long as they terminate with an interface that matches the sample transfer flange 260.

Further, as described with respect to FIGS. 4-6, various components within the chuck assembly 300 may be interchanged. For example, the upper chuck piece 340 and the coupling plate 330 may be replaced with similarly sized components having somewhat different functions. As an example, the upper chuck piece 340, which includes internal conduits to allow the flow of water, allowing the substrate to be cooled, may be replaced with a different chuck that includes internal resistive heaters with heat the substrate.

The substrate processing system described herein facilitates the processing of devices on a substrate. For example, in one embodiment, a substrate may be disposed on a chuck assembly, using with the wafer clamp or the wafer carrier. The chuck assembly is disposed within the lower assembly, as described above. A first upper assembly is then attached to the lower assembly. Vacuum is created within the processing chamber, and a first process may be performed on the substrate. This first process may be, for example, an etching, amorphizing, deposition, sputtering, ion implantation, or another process. After the first process has been performed, the first upper assembly may be removed and replaced with a second upper assembly, which is disposed on the same lower assembly. Vacuum is created within the processing chamber, and a second process may be performed on the substrate. This second process may be, for example, any of the processes listed above. This sequence may be repeated for an arbitrary number of processes using any number of upper assemblies. Thus, unlike conventional systems, where the substrate is moved to different specialized chambers, the present processing system allows the substrate to remain within the lower assembly, while different upper assemblies are clamped thereon, allowing different processes to be performed without moving the substrate to another chamber.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a substrate, the substrate having a characteristic dimension of up to about 1-2 inches, the method comprising:
    disposing the substrate on a chuck assembly located within a lower assembly of a processing chamber, wherein the lower assembly comprises a flange having a central opening;
    attaching a first upper assembly to the lower assembly, wherein the first upper assembly comprises:
    a first hollow cylindrical tube;
    a top flange sealed to a first end of the first hollow cylindrical tube;
    a bottom flange having a central opening in communication with a second end of the first hollow cylindrical tube;
    and an antenna disposed outside the first hollow cylindrical tube;
    wherein the bottom flange of the first upper assembly and the flange of the lower assembly, when attached, form an airtight seal;
    adjusting a height of the chuck assembly so that the chuck assembly moves into a volume defined by the first hollow cylindrical tube such that the substrate is disposed above an interface between the lower assembly and the first upper assembly;
    performing a first process on the substrate, where the first upper assembly is adapted to perform the first process;
    removing the first upper assembly from the lower assembly;
    attaching a second upper assembly to the lower assembly, wherein the second upper assembly comprises:
    a second hollow cylindrical tube, different from the first hollow cylindrical tube;
    a top flange sealed to a first end of the second hollow cylindrical tube;
    a bottom flange having a central opening in communication with a second end of the second hollow cylindrical tube;
    and a sputtering gun disposed within the second hollow cylindrical tube;
    wherein the bottom flange of the second upper assembly and the flange of the lower assembly, when attached, form an airtight seal; and
    performing a second process on the substrate, different than the first process, where the second upper assembly is adapted to perform the second process; and
    wherein the second process comprises a sputter deposition process and wherein the first process is selected from the group consisting of etching, amorphizing, and ion implantation.

2. The method of claim 1, wherein the lower assembly comprises a first predefined interface for connection to the chuck assembly and a second predefined interface for connection to one of a plurality of upper assemblies, wherein the plurality of upper assemblies includes the first upper assembly and the second upper assembly.

3. The method of claim 1, wherein the substrate remains disposed on the chuck assembly while the first upper assembly is removed and the second upper assembly is attached.

4. The method of claim 1, further comprising replacing at least a portion of the chuck assembly with different components to create a second chuck assembly, and installing the second chuck assembly in the lower assembly, wherein the substrate is disposed on the second chuck assembly during the second process.

5. The method of claim 1, wherein at least one of the first upper assembly and the second upper assembly comprises a utility port, the method further comprising introducing a diagnostic tool to a plasma chamber through the utility port.

6. The method of claim 1, wherein the first upper assembly comprises a gas showerhead disposed within the first hollow cylindrical tube for introducing a gas into a volume defined by the first hollow cylindrical tube, and wherein the antenna of the first upper assembly comprises a helical coil disposed around an outer surface of the first hollow cylindrical tube.

7. The method of claim 6, wherein the helical coil is configured to slide vertically along the outer surface.

8. The method of claim 6, wherein a distance from the gas showerhead to the top flange is adjustable.

9. The method of claim 1, wherein the antenna of the first upper assembly comprises a planar coil disposed on the top flange.

10. The method of claim 1, wherein each of the first upper assembly and the second upper assembly comprises a chamber head, wherein fasteners, disposed outside the first hollow cylindrical tube and the second hollow cylindrical tube, are used to connect the chamber head, a respective one of the first hollow cylindrical tube or the second hollow cylindrical tube and the bottom flange together.

11. The method of claim 1, wherein a gate valve is disposed between the first upper assembly and the lower assembly, and the method further comprises vertically adjusting the chuck assembly and closing the gate valve after performing the first process and before removing the first upper assembly so as to maintain vacuum.

12. The method of claim 11, further comprising opening the gate valve after the second upper assembly is attached and before performing the second process.

13. A method of processing a substrate, the substrate having a characteristic dimension of up to about 1-2 inches, the method comprising:
    disposing the substrate on a chuck assembly located within a lower assembly of a processing chamber, wherein the lower assembly comprises a flange having a central opening;
    attaching a first upper assembly to the lower assembly, wherein the first upper assembly comprises:
    a first hollow cylindrical tube;
    a top flange sealed to a first end of the first hollow cylindrical tube;
    a bottom flange having a central opening in communication with a second end of the first hollow cylindrical tube;
    and a sputtering gun disposed within the first hollow cylindrical tube;
    wherein the bottom flange of the first upper assembly and the flange of the lower assembly, when attached, form an airtight seal;

adjusting a height of the chuck assembly so that the chuck assembly moves into a volume defined by the first hollow cylindrical tube such that the substrate is disposed above an interface between the lower assembly and the first upper assembly;

performing a first process on the substrate, where the first upper assembly is adapted to perform the first process;

removing the first upper assembly from the lower assembly;

attaching a second upper assembly to the lower assembly, wherein the second upper assembly comprises:

a second hollow cylindrical tube, different from the first hollow cylindrical tube;

a top flange sealed to a first end of the second hollow cylindrical tube;

a bottom flange having a central opening in communication with a second end of the second hollow cylindrical tube;

and an antenna disposed outside the second hollow cylindrical tube; and performing a second process on the substrate, different than the first process, where the second upper assembly is adapted to perform the second process; and wherein the first process comprises a sputter deposition process; and wherein the second process is selected from the group consisting of etching, amorphizing, and ion implantation.

14. The method of claim 13, wherein the lower assembly comprises a first predefined interface for connection to the chuck assembly and a second predefined interface for connection to one of a plurality of upper assemblies, wherein the plurality of upper assemblies includes the first upper assembly and the second upper assembly.

15. The method of claim 13, wherein the substrate remains disposed on the chuck assembly while the first upper assembly is removed and the second upper assembly is attached.

16. The method of claim 13, further comprising replacing at least a portion of the chuck assembly with different components to create a second chuck assembly, and installing the second chuck assembly in the lower assembly, wherein the substrate is disposed on the second chuck assembly during the second process.

17. The method of claim 13, wherein at least one of the first upper assembly and the second upper assembly comprises a utility port, the method further comprising introducing a diagnostic tool to a plasma chamber through the utility port.

18. The method of claim 13, wherein the second upper assembly comprises a helical coil disposed around an outer surface of the second hollow cylindrical tube, and a gas showerhead disposed within the second hollow cylindrical tube for introducing a gas into a volume defined by the second hollow cylindrical tube.

19. The method of claim 18, wherein the helical coil is configured to slide vertically along the outer surface.

20. The method of claim 18, wherein a distance from the gas showerhead to the top flange is adjustable.

21. The method of claim 13, wherein the second upper assembly comprises a planar coil disposed on the top flange.

22. The method of claim 13, wherein each of the first upper assembly and the second upper assembly comprises a chamber head, wherein fasteners, disposed outside the first hollow cylindrical tube and the second hollow cylindrical tube, are used to connect the chamber head, a respective one of the first hollow cylindrical tube or the second hollow cylindrical tube and the bottom flange together.

23. The method of claim 13, wherein a gate valve is disposed between the first upper assembly and the lower assembly, and the method further comprises vertically adjusting the chuck assembly and closing the gate valve after performing the first process and before removing the first upper assembly so as to maintain vacuum.

24. The method of claim 23, further comprising opening the gate valve after the second upper assembly is attached and before performing the second process.

* * * * *